United States Patent [19]

Maa

[11] Patent Number: 4,585,515

[45] Date of Patent: Apr. 29, 1986

[54] FORMATION OF CONDUCTIVE LINES

[75] Inventor: Jer-shen Maa, Plainsboro Township, Middlesex County, N.J.

[73] Assignee: RCA Corporation, Princeton, N.J.

[21] Appl. No.: 710,284

[22] Filed: Mar. 11, 1985

[51] Int. Cl.[4] .................. H01L 21/306; B44C 1/22; C03C 15/00; C23F 1/02

[52] U.S. Cl. .................................. 156/643; 29/591; 156/644; 156/646; 156/653; 156/656; 156/657; 156/659.1; 156/662; 204/192 E; 252/79.1; 357/65; 427/88

[58] Field of Search ............... 156/643, 644, 646, 653, 156/656, 657, 659.1, 661.1, 662; 204/164, 192 EC, 192 E, 298; 427/88, 38, 39; 29/591; 357/59, 65; 430/313, 317, 318; 252/79.1

[56] References Cited

U.S. PATENT DOCUMENTS 4,410,622 10/1983 Dalal et al. .................... 430/312

4,411,734 10/1983 Maa ................................ 156/643

*Primary Examiner*—William A. Powell
*Attorney, Agent, or Firm*—Birgit E. Morris; R. Hain Swope

[57] ABSTRACT

A process of forming conductive lines of fine dimensions over a substrate having topographical features without the formation of conductive stringers is disclosed. Openings of the desired dimensions overlying the topographical features are lithographically defined in a layer of planarizing dielectric material deposited on the substrate. A layer of doped silicon is deposited thereover and isotropically etched to remove all except for the portion in the openings in the dielectric layer. A layer of metal is deposited to overlie only the silicon in the openings in the dielectric layer. The structure is annealed to convert the metal to metal silicide and the remaining dielectric layer is removed.

12 Claims, 5 Drawing Figures

FORMATION OF CONDUCTIVE LINES

This invention relates to a process of forming conductive lines over vertical steps in substrate topography.

BACKGROUND OF THE INVENTION

The replacement of doped, polycrystalline silicon structures as gate and interconnection material in very high speed integrated circuits (VHSIC) with other materials having lower sheet resistivity and, therefore, increased speed, is of substantial interest in the electronics industry. A material which has been used in such devices is a bi-layer structure composed of a refractory metal silicide overlying a layer of doped polycrystalline silicon, commonly referred to as a "polycide" structure.

A major problem associated with polycide structures is that it is difficult to etch a layer of polycide material to very fine dimensions, i.e. a micrometer or less, when it overlies vertical steps in substrate topography without the formation of conductive residues called "stringers". Stringers occur at the base of vertical steps and are difficult to eliminate, even with extended overetching. If they are not removed, they will short out a device incorporating the structure. The degree of overetching required to remove stringers often causes other problems, such as erosion of the resist with loss of linewidth definition, etching of underlying gate oxide which is exposed to the plasma during overetching, and undercutting of one or both layers of the structure. It will be appreciated that these problems become more critical as linewidths and the thickness of gate oxide decrease.

In accordance with this invention, a process has been found to provide fine dimension lines of polycide overlying vertical steps without any of the disadvantages of the prior art.

SUMMARY OF THE INVENTION

A first layer of planarizing dielectric material is deposited over a substrate having topography and lithographically patterned to form opening overlying the topographical features. A layer of doped silicon is then deposited thereover and isotropically etched so that none remains except in the openings in the dielectric layer. A layer of metal, e.g. tungsten or tantalum, is deposited on the silicon to substantially fill the openings in the dielectric layer. The structure is annealed to convert the metal to metal silicide and the dielectric is removed.

DETAILED DESCRIPTION OF THE INVENTION

The substrate utilized for the subject process may be, for example, of single crystalline silicon, gallium arsenide, polycrystalline materials with suitable surfaces, vitreous materials or the like, having topographical features. A preferred substrate is sapphire which is conventionally used in silicon-on-sapphire (SOS) device applications.

Figure 1:
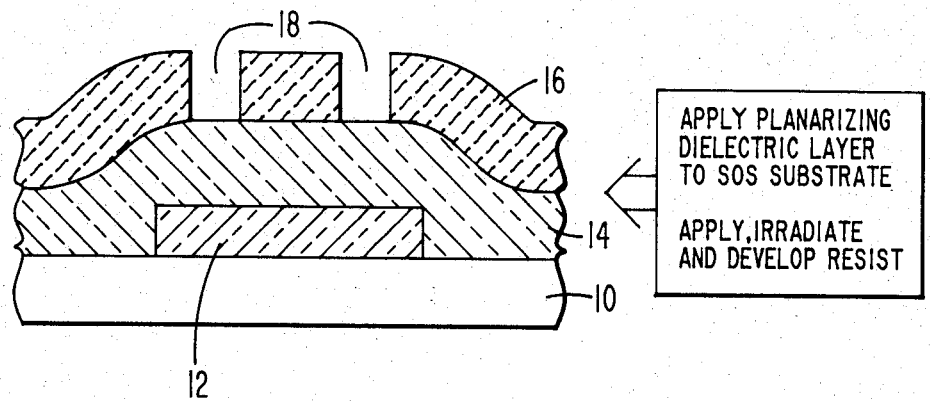
FIGS. 1-5 are elevational views in broken section illustrating the process of this invention.

A typical SOS substrate, shown in FIG. 1, comprises a polished sapphire substrate 10 having thereon an island 12 of epitaxial silicon. Conventionally, a layer of single crystal silicon is epitaxially deposited onto the substrate by the thermal decomposition of silane ($SiH_4$) in a hydrogen ambient. The silicon is typically grown to a thickness of from about 0.3 to about 0.6 micrometer. Thereafter, the silicon layer is lithographically formed into islands 12 by etching, as is well known in the art.

In accordance with this invention, the SOS substrate is initially coated with a layer of planarizing dielectric 14. This material, in addition to being nonconductive and having good planarizing qualities, must be able to withstand high processing temperatures, on the order of about 600°-1050° C., and have a high etch selectivity with respect to the substrate, particularly the epitaxial silicon islands. Suitable dielectric materials include silicon dioxide, silicon nitride and silicon oxynitride, with silicon dioxide being preferred. The dielectric layer 14 is conventionally deposited, e.g. by chemical vapor deposition (CVD) or plasma enhanced chemical vapor deposition (PECVD). Silicon dioxide, for example is deposited by CVD from a mixture of silane ($SiH_4$) and oxygen and by PECVD from a mixture of silane and nitrous oxide ($N_2O$).

The dielectric layer 14 is typically from about 0.8 to 2 micrometers in thickness, measured from the flat plane of the substrate, and in general is at least about two times the thickness of the topography 12 on the substrate 10. The dielectric layer 14 is in turn covered with a layer of resist material 16 which is conventionally irradiated and developed to form openings 18 as illustrated in FIG. 1.

Figure 2:
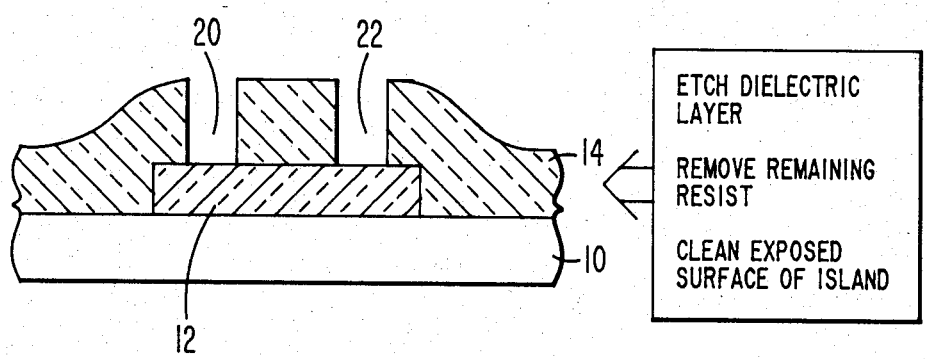

Utilizing the patterned resist layer 16 as a mask, openings 20 and 22 are anisotropically etched in the dielectric layer 14 overlying the island 12 as shown in FIG. 2.

The etching of the dielectric layer 14 is suitably carried out in a conventional plasma etching reactor utilizing an etch mixture of, for example, trifluoromethane and oxygen, trifluoromethane and hydrogen or carbon tetrafluoride and hydrogen. A preferred etch mixture is trifluoromethane and hydrogen, suitably in the ratio 91:9 by volume. There is the possibility that stringers will form on the vertical sides of island 12 where the etched openings 20 and 20 pass over. Such stringers, however, are nonconductive and will not produce shorting. Therefore, they are not detrimental to the functioning of a device incorporating the structures produced by the subject process and they need not be removed. After etching of the dielectric layer is completed, the remaining resist layer 16 is removed, suitably by an oxygen plasma etch, or by immersion in a solvent therefor to produce the structure shown in FIG. 2. The surface of islands 12 exposed in openings 20 and 22 is then cleaned with, for example, a mixture of hydrogen peroxide and sulfuric acid followed by immersion in a buffered hydrofluoric acid ($NH_4F/HF$) solution.

Figure 3:
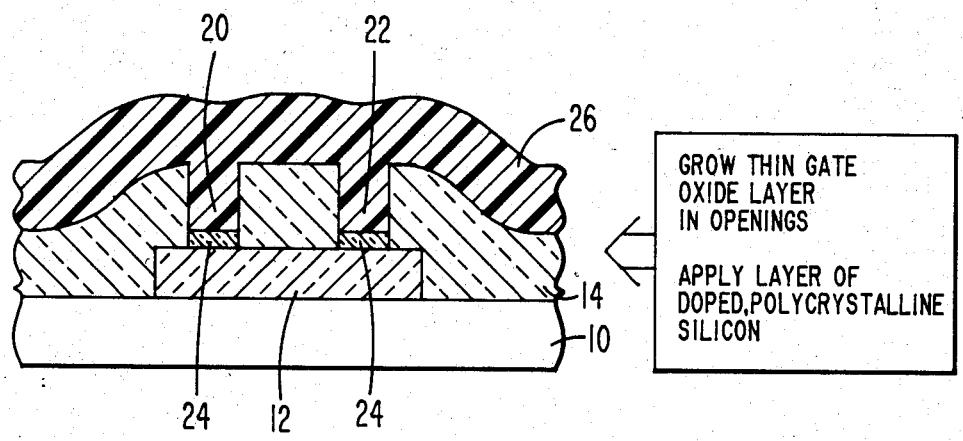

The structure is then heated in steam at about 825° C. for from about 15 to 30 minutes to grow a layer of gate oxide 24 on the exposed portion of island 12 as shown in FIG. 3. The layer of gate oxide 24 is suitably from about 200 to 300 angstroms in thickness. A layer of doped silicon 26 is deposited over the structure as shown in FIG. 3. The layer of doped silicon is preferably from about 0.5 to 1 micrometer thick. Although the silicon layer 26 may be formed in any conventional manner in either the polycrystalline or amorphous state, it is preferred that it be grown in the amorphous state, suitably by low pressure chemical vapor deposition (LPCVD) at a temperature of 560°-580° C. from a silicon-containing vapor such as silane and a suitable dopant, preferably phosphine. The silicon layer 26 is subsequently heated to convert it to the polycrystalline state.

The layer of doped silicon 26 is isotropically etched by either wet or dry etching technique so that none remains on the surface of the dielectric layer, yet there remain deposits of doped silicon 26 within the openings 20 and 22 in the dielectric layer 14. It is preferred to plasma etch the doped silicon layer 26 utilizing an etchant mixture of carbon tetrafluoride and oxygen. These deposits of doped silicon 26 are puddled, i.e. they are below the surface of the dielectric layer 14, as shown in FIG. 4.

Figure 4:
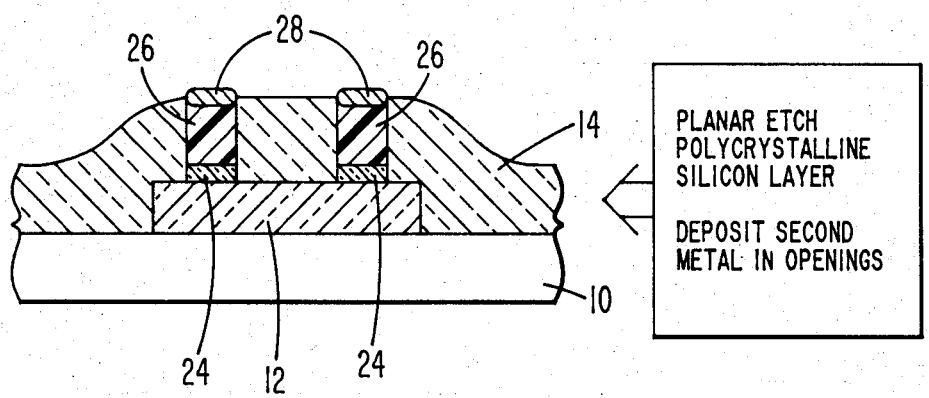

A layer of metal 28 is selectively deposited into the openings 20 and 22 in the dielectric layer 14 so that it contacts the doped silicon 26 therein as shown in FIG. 4. A preferred metal is tungsten, although tantalum, titanium, niobium or molybdenum could be utilized as well. Where possible, the metal is deposited by selective chemical vapor deposition. Tungsten, for example, will selectively deposit on silicon, but not on silicon dioxide by CVD from tungsten hexafluoride and hydrogen. Alternatively, a layer of metal is deposited over the entire substrate and isotropically etched by conventional means to the surface of the dielectric layer 14. The coating of the metal 28 remaining in the openings 20 and 22 is thin, for example between about 500 and 1500 angstroms, and extends to the surface of the dielectric layer 14. The structure is then heated to between about 850° and 1050° C. preferably between about 900° and 1000° C., in an inert atmosphere, e.g. an argon furnace, for about 30 minutes. This annealing step forms the metal silicide 30 of the metal 28 and, if the silicon layer 26 had been deposited in the amorphous state, converts it to the polycrystalline state. The structure can also be rapidly annealed, for example, by heat lamp annealing at 1050° C. for about 10 seconds utilizing conventional apparatus.

Figure 5:
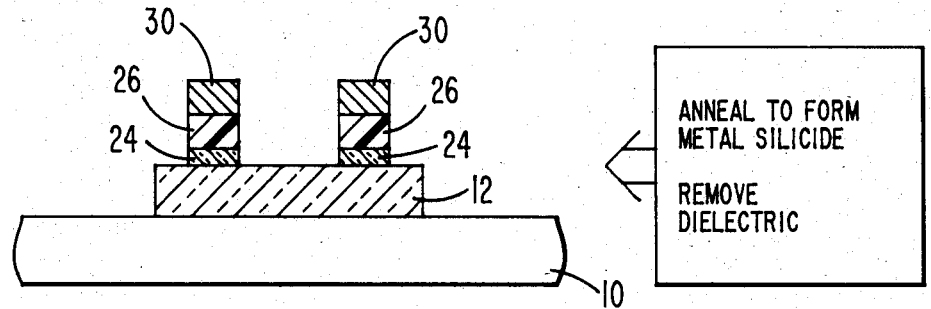

The structure is plasma etched in a suitable plasma, such as $CHF_3/H_2$, which selectively etches away the dielectric layer 14 leaving the structure shown in FIG. 5. In certain instances, it may be desired to leave the dielectric layer in place. However, in most instances it must be removed in order that other operations such as doping of the substrate can be carried out.

The present process thus produces well defined conductive lines which can have a width of less than one micrometer overlying substrate topography without the disadvantage of conductive stringers which were formed in previous methods of producing such structures. The structures illustrated in FIG. 5 may be further processed in accordance with conventional techniques into, e.g. insulated gate field effect transistors (IGFET) or similar devices.

The invention has been described with reference to preferred embodiments thereof. It will be appreciated by those skilled in the art that various modifications may be made from the specific details given without departing from the spirit and scope of the invention.

I claim:

1. A process of forming conductive lines on a substrate having topographical features comprising:
    (a) depositing a layer of planarizing dielectric material on the substrate;
    (b) forming a patterned layer of resist material over the layer of dielectric material wherein the exposed portion of the dielectric layer overlies topographical features on the substrate;
    (c) etching away the exposed dielectric layer;
    (d) removing the remaining resist layer;
    (e) depositing a layer of doped silicon over the structure;
    (f) isotropically etching the silicon layer thereby removing it from the surface of the dielectric layer leaving only a portion thereof in the openings in the dielectric layer;
    (g) depositing a metal to overlie the silicon in said openings;
    (h) annealing the structure to convert the metal to metal silicide; and
    (i) removing the remaining dielectric layer.

2. A process in accordance with claim 1, wherein the substrate is sapphire having silicon topographical features thereon.

3. A process in accordance with claim 1, wherein the planarizing dielectric material is silicon dioxide.

4. A process in accordance with claim 3, wherein the dielectric layer is plasma etched with a mixture of trifluoromethane and hydrogen.

5. A process in accordance with claim 1, wherein the doped silicon layer is deposited in the amorphous state by low pressure chemical vapor deposition from a source of silicon and a suitable dopant at a temperature of from about 560° to 580° C. and the annealing step converts said layer to the polycrystalline state.

6. A process in accordance with claim 5, wherein the source of silicon is silane and the dopant is phosphine.

7. A process in accordance with claim 1, wherein the silicon layer is isotropically plasma etched with a mixture of carbon tetrafluoride and oxygen.

8. A process in accordance with claim 1, wherein the metal is selected from the group consisting of tungsten, tantalum, titanium, niobium and molybdenum.

9. A process in accordance with claim 8, wherein the metal is tungsten.

10. A process in accordance with claim 9, wherein the dielectric material is silicon dioxide and tungsten is selectively deposited on the silicon in said openings by chemical vapor deposition from a mixture of tungsten hexafluoride and hydrogen.

11. A process in accordance with claim 8, wherein the metal is tantalum.

12. A process in accordance with claim 1, wherein the metal is deposited over the surface of the structure formed in step (f) and said metal layer is isotropically etched to leave only that portion overlying the silicon in said openings.

* * * * *